(12) United States Patent
Peng et al.

(10) Patent No.: US 10,444,555 B2
(45) Date of Patent: Oct. 15, 2019

(54) DISPLAY SCREEN, ELECTRONIC DEVICE, AND LIGHT INTENSITY DETECTION METHOD

(71) Applicant: Lenovo (Beijing) Co., Ltd., Beijing (CN)

(72) Inventors: Shaopeng Peng, Beijing (CN); Nan Lin, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/941,768

(22) Filed: Mar. 30, 2018

(65) Prior Publication Data

US 2019/0101779 A1     Apr. 4, 2019

(30) Foreign Application Priority Data

Sep. 30, 2017     (CN) .......................... 2017 1 0915766

(51) Int. Cl.
*H01L 31/103*     (2006.01)
*G02F 1/133*     (2006.01)
(Continued)

(52) U.S. Cl.
CPC ........ *G02F 1/13318* (2013.01); *G01J 1/0271* (2013.01); *G01J 1/0418* (2013.01); *G01J 1/0437* (2013.01); *G01J 1/4204* (2013.01); *G01J 1/44* (2013.01); *G02F 1/1345* (2013.01); *G02F 1/133512* (2013.01); *G02F 1/133514* (2013.01); *G02F 1/1368* (2013.01); *G02F 2001/133302* (2013.01); *G02F 2201/58* (2013.01); *G02F 2202/09* (2013.01); *G02F 2202/103* (2013.01); *H01L 27/322* (2013.01); *H01L 27/3227* (2013.01); *H01L 27/3272* (2013.01); *H01L 27/3276* (2013.01); *H01L 31/022475* (2013.01); *H01L 31/03762* (2013.01); *H01L 31/103* (2013.01)

(58) Field of Classification Search
CPC .. G02F 1/13318; G02F 1/133512; G01J 1/44; G01J 3/51; G01J 1/0214; G01J 1/4204; H01L 27/3227; H01L 27/3272; G09G 3/3406
See application file for complete search history.

(56) References Cited

U.S. PATENT DOCUMENTS 4,660,277 A * 4/1987 Tei .................. H01L 31/095
257/E31.094
4,868,623 A * 9/1989 Nishiura ........... H01L 27/14665
257/53
(Continued)

*Primary Examiner* — Maurice C Smith
(74) *Attorney, Agent, or Firm* — Anova Law Group, PLLC

(57) ABSTRACT

A display screen includes a first glass substrate including a color filter region and a light shielding region. The light shielding region includes a transparent region at a first position of the light shielding region. The display screen further includes a second glass substrate including a display control circuit. The display control circuit controls display statuses of the color filter region. The display screen also includes a light intensity sensor at a second position of the second glass substrate. The first position and the second position satisfy a preset relative positional correspondence to allow light transmitted through the first position to reach the light intensity sensor.

8 Claims, 11 Drawing Sheets

(51) Int. Cl.
  *G01J 1/04* (2006.01)
  *G01J 1/44* (2006.01)
  *G02F 1/1335* (2006.01)
  *G02F 1/1345* (2006.01)
  *G01J 1/02* (2006.01)
  *G01J 1/42* (2006.01)
  G02F 1/1368 (2006.01)
  G02F 1/1333 (2006.01)
  H01L 27/32 (2006.01)
  H01L 31/0224 (2006.01)
  H01L 31/0376 (2006.01)

(56) References Cited

U.S. PATENT DOCUMENTS

| | | | | |
|---|---|---|---|---|
| 5,232,860 A | * | 8/1993 | Kawanishi | H01L 31/03921 136/256 |
| 5,449,923 A | * | 9/1995 | Kuo | H01L 31/101 136/255 |
| 2008/0164481 A1 | * | 7/2008 | Tai | G09G 3/3406 257/81 |
| 2009/0321640 A1 | * | 12/2009 | Onogi | G01J 1/1626 250/338.1 |
| 2010/0238150 A1 | * | 9/2010 | Matsuki | G01J 1/02 345/207 |
| 2010/0282953 A1 | * | 11/2010 | Tam | G01J 1/1626 250/226 |
| 2010/0315382 A1 | * | 12/2010 | Kurihara | G02F 1/13338 345/175 |
| 2013/0076712 A1 | * | 3/2013 | Zheng | G01J 1/32 345/207 |
| 2014/0078503 A1 | * | 3/2014 | Matsushita | G02B 26/001 356/416 |

* cited by examiner

FIG. 13

```
Generate induced electric current by using a light intensity sensor    1301
arranged at a second position of the second glass substrate of the
display screen to detect a light intensity of light passing through a
first position of the light shielding regions of the first glass substrate,
where the light shielding material at the first position of the light
shielding regions is etched away
                          ↓
Convert the induced electric current into a voltage signal, and        1302
determine a light intensity of the ambient light according to the
voltage signal
```

DISPLAY SCREEN, ELECTRONIC DEVICE, AND LIGHT INTENSITY DETECTION METHOD

CROSS-REFERENCE TO RELATED APPLICATION

This application claims priority to Chinese Patent Application No. 201710915766.6, filed on Sep. 30, 2017, the entire contents of which are incorporated herein by reference.

TECHNICAL FIELD

The present disclosure generally relates to the field of light intensity detection technologies and, more particularly, to a display screen, an electronic device, and a light intensity detection method.

BACKGROUND

In order to meet the user's sensory needs on the screen, screens of mobile terminals tend to adopt narrow bezels. An ultimate is a full screen. As indicated by its name, in a full screen, the entire or most of the area of the screen is used for display.

In order to improve a screen-to-body ratio of a terminal, the screen develops from an aspect ratio of approximately 16:9 to an aspect ratio of approximately 18:9. However, a front-facing camera and a light intensity sensor need to be placed in the front of the screen. Irregular-shape cutting is performed in an upper region of the screen to generate a notch and thus make room for the front-facing camera and the light intensity sensor. However, such screen cannot fully expand the screen area regardless of how the screen ratio is increased.

SUMMARY

In one aspect, the present disclosure provides a display screen. The display screen includes a first glass substrate including a color filter region and a light shielding region. The light shielding region includes a transparent region at a first position of the light shielding region. The display screen further includes a second glass substrate including a display control circuit. The display control circuit controls display statuses of the color filter region. The display screen also includes a light intensity sensor at a second position of the second glass substrate. The first position and the second position satisfy a preset relative positional correspondence to allow light transmitted through the first position to reach the light intensity sensor.

Another aspect of the present disclosure provides a light intensity detection method including generating an induce electric current by using a light intensity sensor to detect a light intensity of ambient light passing through a transparent region at a first position of a light shielding region of a first glass substrate of a display screen. The light intensity sensor is at a second position of a second glass substrate of the display screen that corresponds to the first position. The method further includes converting the induced electric current into a voltage signal and determining a light intensity of the ambient light according to the voltage signal.

BRIEF DESCRIPTION OF THE FIGURES

The following drawings are merely examples for illustrative purposes according to various disclosed embodiments and are not intended to limit the scope of the present disclosure.

FIG. 13 is a flowchart of an example of light intensity detection method consistent with disclosed embodiments.

DETAILED DESCRIPTION OF EMBODIMENTS

Embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the embodiments of the present disclosure further described in detail with reference to the accompanying drawings.

In the present disclosure, a light intensity sensor may be arranged inside a display screen and integrated with the display screen of a terminal, such that a notch space may be relatively small and the screen-to-body ratio (STBR) of the terminal may be further increased.

Figure 1:
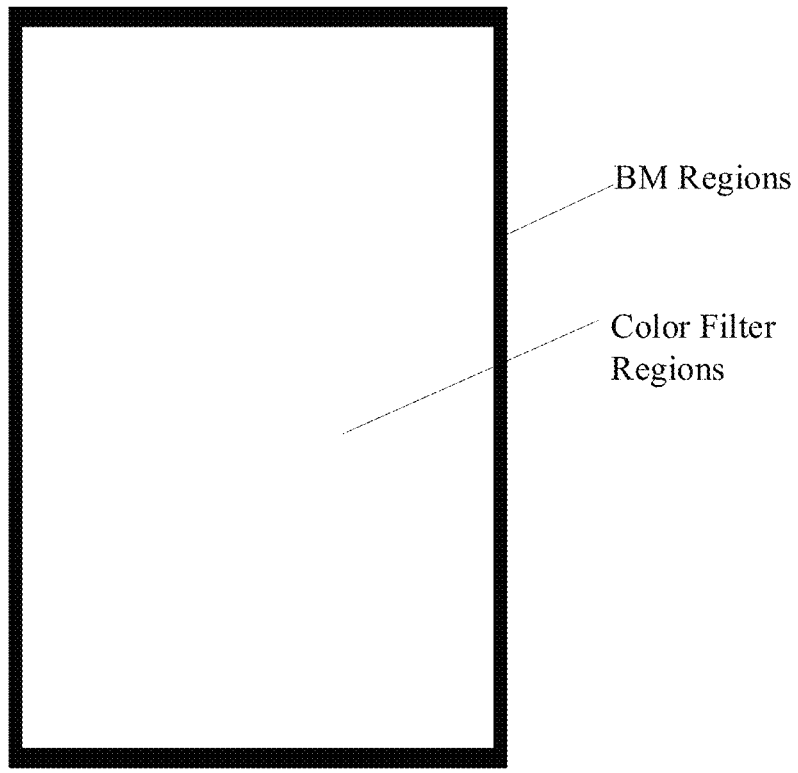
FIG. 1 is a schematic view of an example of display screen consistent with disclosed embodiments.

FIG. 1 is a schematic view of an example of display screen consistent with disclosed embodiments. A surface of the display screen has two types of regions. One includes a color filter region and the other includes a black matrix region, i.e., a light shielding region. A color filter region contains a filter material, such as a red (R) filter material, a green (G) filter material, and/or a blue (B) filter material. A black matrix region contains a light shielding material, such as a black ink. The black matrix regions may be further divided into two portions. Some black matrix regions may be distributed between pixels of the color filter regions. The other black matrix regions may surround peripheries of the outermost edges of the color filter regions. The black matrix regions distributed between pixels of the color filter regions may suppress color interference between pixels. The black matrix regions surrounding the peripheries of the outermost edges of the color filter region may suppress light leakage. After the display screen is powered on, a clear picture may be displayed under the illumination of the internal backlight. The black matrix regions surrounding the peripheries of the outermost edges of the color filter region may prevent light from leaking through the edges of the display screen. If the black matrix regions surrounding the peripheries of the outermost edges of the color filter regions are relatively narrow, light leakage may occur at the edges of the screen when the screen displays a pure black image. Further, light halo may even be visible. In addition, these black matrix regions surrounding the peripheries may need to cover wires in the display screen.

In some embodiments, sizes of the black matrix regions that are distributed between pixels are relatively small as compared to the black matrix regions surrounding the peripheries of the outermost edges of the color filter regions. Generally, naked eyes cannot directly see the black matrix regions that are distributed between pixels, but can see the black matrix regions surrounding the peripheries of the outermost edges of the color filter regions. In some scenarios, such as a scenario that the display screen is turned on to display an image of a color other than black, e.g., a white image, the black matrix regions surrounding the peripheries of the outermost edges of the color filter region may be relatively easy to observe. FIG. 1 shows only the black matrix regions surrounding the peripheries of the outermost edges of the color filter regions, where the black matrix regions are labeled as BW region(s).

In the following descriptions of the embodiments of the present disclosure, the term "BW region(s)" refers to continuous light shielding regions surrounding the peripheries of the outermost edges of the color filter regions.

Figure 2:
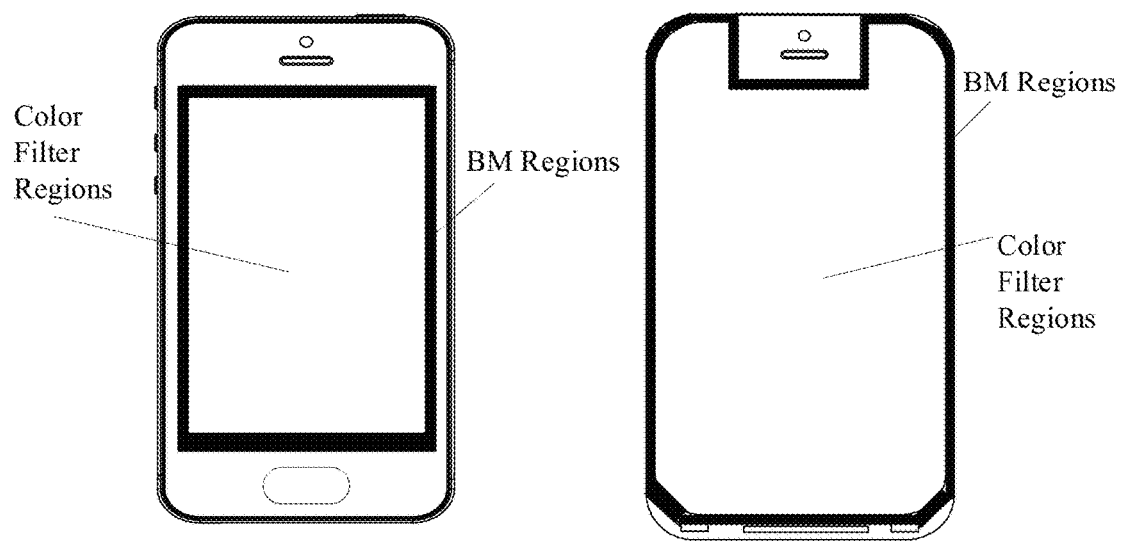
FIG. 2 illustrates a schematic view of examples of terminals consistent with disclosed embodiments.

FIG. 2 illustrates a schematic view of examples of terminals consistent with disclosed embodiments. As shown in FIG. 2, the terminal on the left includes a universal display screen, and regions outside the BM regions of the display screen belong to a panel of the terminal. The panel may be white, black, and/or other color(s).

The terminal on the right part of FIG. 2 includes an irregular-shape display screen. An upper surface of the right terminal has a relatively high screen-to-body ratio. That is, the upper surface of the terminal mostly consists of an upper surface of the display screen. The regions outside the BM regions of the display screen are bezels of the terminal.

In some embodiments, a collection region of a light intensity sensor/ambient light sensor may correspond to a first position in the light shielding region(s), and the first position may correspond to a transparent window. The first position may be at a certain position of a light shielding array region or may be at a certain position of a light shielding continuous region. In some embodiments, the first position may be arranged at a certain position in the light shielding continuous region (BM region) for relatively convenient engineering and reduced cost.

Figure 3:
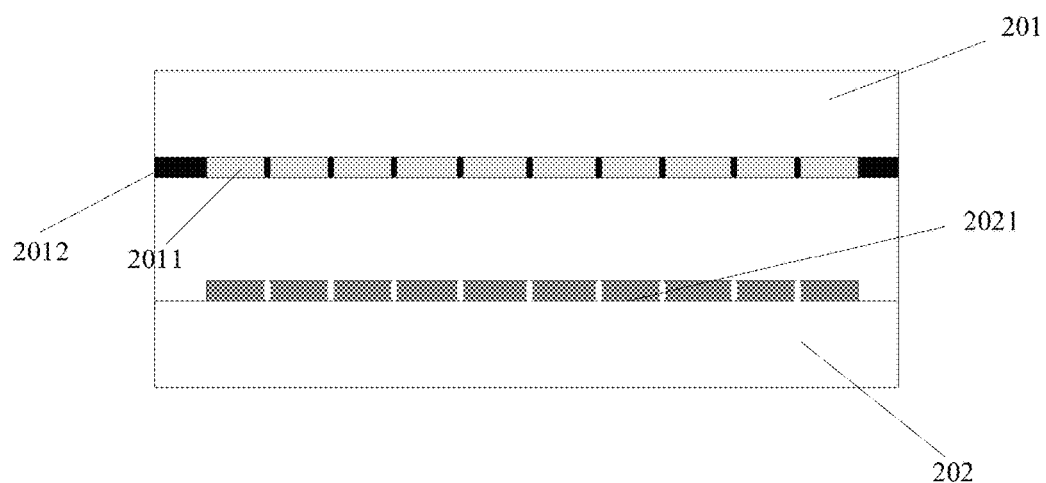
FIG. 3 is a schematic view of another example of display screen consistent with disclosed embodiments.

FIG. 3 is a schematic view of another example of display screen consistent with disclosed embodiments. As shown in FIG. 3, the display screen includes a first glass substrate 201 and a second glass substrate 202. The first glass substrate 201 includes color filter regions 2011 and light shielding regions 2012 arranged on the first glass substrate 201, where the light shielding regions 2012 are located at peripheries of the color filter regions 2011. The second glass substrate 202 includes display control circuits 2021 for controlling display statuses of the color filter regions 2011 over the first glass substrate 201.

In some embodiments, materials of the first glass substrate and the second glass substrate may include glass, and thicknesses of the first and second glass substrates may be in the order of millimeters. The first glass substrate is also referred to as a "CF Glass," and the second glass substrate is also referred to as a "TPS Glass."

The first glass substrate may realize color display. The second glass substrate may control the color display. The first glass substrate and the second glass substrate are further described below.

Color filter regions and light shielding regions may be arranged over the first glass substrate. The color filter region is referred to as a CF (Color Filter) region, and the light shielding region may be located at the peripheries of the CF regions. A fabrication process of the first glass substrate is described below. A layer of black ink, which includes a light shielding material, is coated on a transparent glass substrate to form a whole light shielding region. A portion of the black ink on the glass substrate is etched away according to an array manner. The remaining black ink forms a light shielding array regions. Further, filter materials are coated between rows and columns of the light shielding array. The filter materials may include a red (R) filter material, a green (G) filter material, and/or a blue (B) filter material. Each color sub-pixel, i.e., each sub-pixel for color display, may be surrounded by the light shielding array region. That is, between two color sub-pixels, i.e., two sub-pixels for color display, a light shielding region may exist. Accordingly, the light shielding array region is formed. In some embodiments, a pixel includes a set of RGB sub-pixels. Regions occupied by the pixels are referred to as "color filter regions." The light shielding array region may be distributed between the pixels of the color filter regions to suppress light leakage between the pixels that may affect a resolution of the display screen. A lap of black ink may exist around outer peripheries of the outermost sub-pixels of the array of RGB sub-pixels. The region including the lap of black ink is referred to as the light shielding continuous region, which is labeled as BM in FIG. 3 is referred to as a BM region.

In some embodiments, a collection region of a light intensity sensor/ambient light sensor may correspond to a first position in the light shielding region(s), and the first position may correspond to a transparent window. The first position may be at a certain position of a light shielding array region or may be at a certain position of a light shielding continuous region. In some embodiments, the first position may be arranged at a certain position in the light shielding continuous region (BM region) for relatively convenient engineering and reduced cost.

Figure 4:
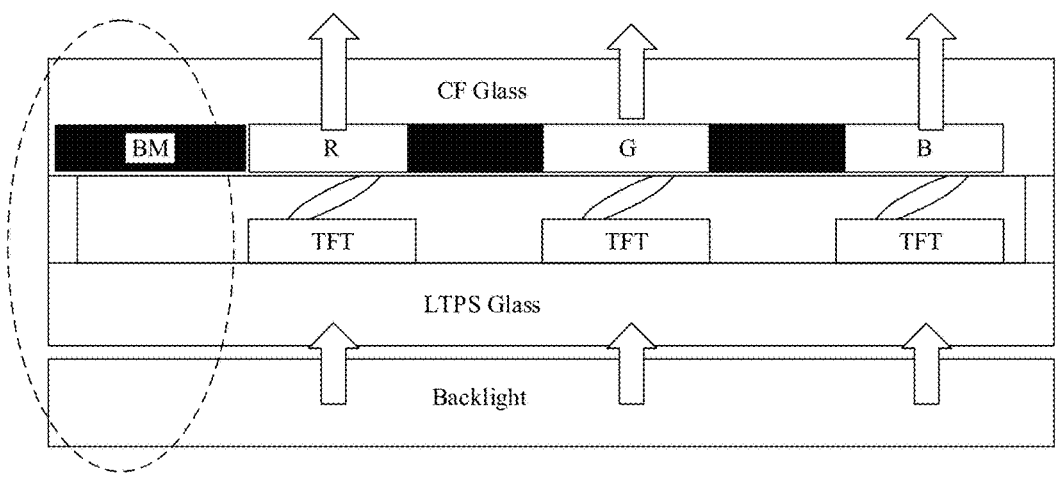
FIG. 4 is a schematic view of another example of display screen consistent with disclosed embodiments.

FIG. 4 is a schematic view of another example of display screen consistent with disclosed embodiments. As shown in FIG. 4, the display screen includes a liquid crystal display (LCD). In the LCD, a liquid crystal cell is arranged between two parallel glass substrates. Thin film transistors (TFTs) are arranged over a lower glass substrate (TPS glass), and color filters, i.e., GRB filters, are arranged to an upper glass substrate (CF glass). Through signal and/or voltage changes of the TFTs, rotation directions of liquid crystal molecules may be controlled. Accordingly, whether polarized light of each pixel is emitted may be controlled to achieve displaying.

In some embodiments, a collection region of a light intensity sensor/ambient light sensor may correspond to a first position in the light shielding region(s), and the first position may correspond to a transparent window. The first position may be at a certain position of a light shielding array region or may be at a certain position of a light shielding continuous region. In some embodiments, the first position may be arranged at a certain position in the light shielding continuous region (BM region) for relatively convenient engineering and reduced cost.

Figure 5:
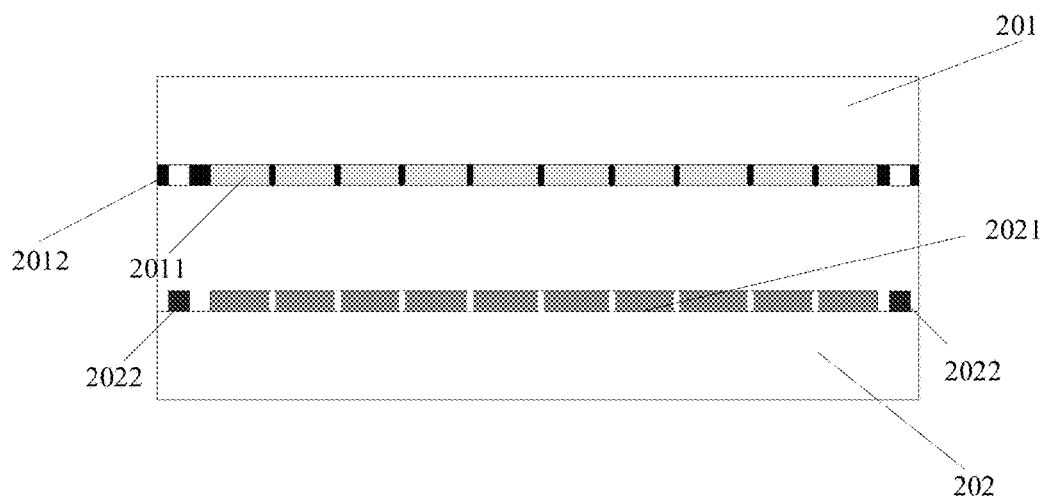
FIG. 5 is a schematic view of another example of display screen consistent with disclosed embodiments.

FIG. 5 is a schematic view of another example of display screen consistent with disclosed embodiments. As shown in FIG. 5, the display screen includes a first glass substrate 201 and a second glass substrate 202. The first glass substrate 201 includes color filter regions 2011 and light shielding regions 2012 arranged on the first glass substrate 201, where the light shielding regions 2012 are located at peripheries of the color filter regions 2011. The second glass substrate 202 includes display control circuits 2021 for controlling display statuses of the color filter regions 2011 over the first glass substrate 201.

The light shielding material at a first position of the light shielding regions 2012 of the first glass substrate 201 is etched away, and a light intensity sensor 2022 is arranged at a second position of the second glass substrate 202. The first position and the second position may satisfy a preset relative positional relationship, such that light transmitting through the first position may be incident on the light intensity sensor 2022.

In some embodiments, a collection region of a light intensity sensor/ambient light sensor may correspond to a first position in the light shielding region(s), and the first position may correspond to a transparent window. The first position may be at a certain position of a light shielding array region or may be at a certain position of a light shielding continuous region. In some embodiments, the first position may be arranged at a certain position in the light shielding continuous region (BM region) for relatively convenient engineering and reduced cost.

In some embodiments, at a certain position, also referred to as the "first position," of the BM regions of the first glass substrate, the light shielding material may be etched away, such that the first position at the first glass substrate may become light transparent. In some embodiments, the first glass substrate and the second glass substrate may be parallel to each other, and a light intensity sensor may be arranged over the second glass substrate at a second position corresponding to the first position. In some embodiments, processes such as photoresist coating, etching, and/or exposure may be adopted to achieve arranging the light intensity sensor over the second glass substrate. Accordingly, external ambient light can reach the light intensity sensor of the second glass substrate through the first position of the first glass substrate, and the light intensity sensor can detect the external ambient light intensity. In the present disclosure, the light intensity sensor may be arranged inside the display screen, such that the light intensity sensor does not occupy a separate space, and the screen-to-body ratio of the terminal can be further increased.

Figure 6:
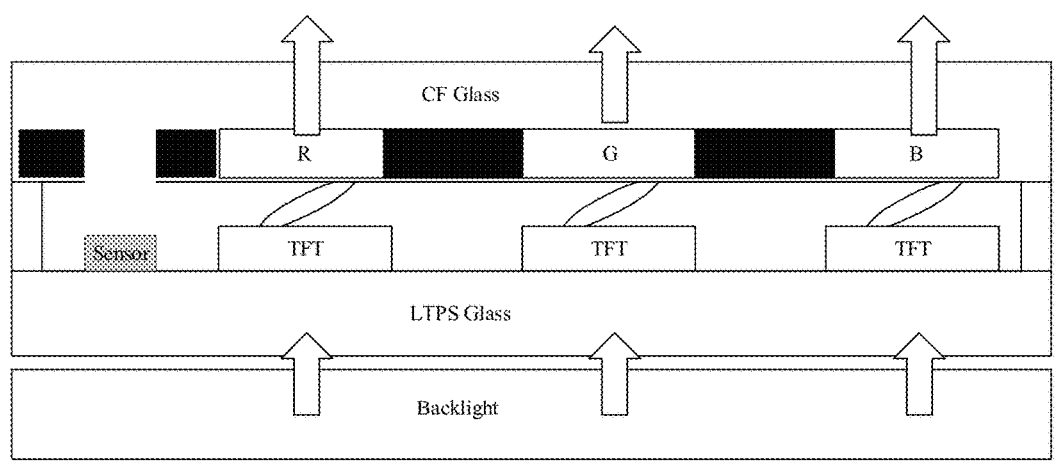
FIG. 6 is a schematic view of another example of display screen consistent with disclosed embodiments.
Figure 7:
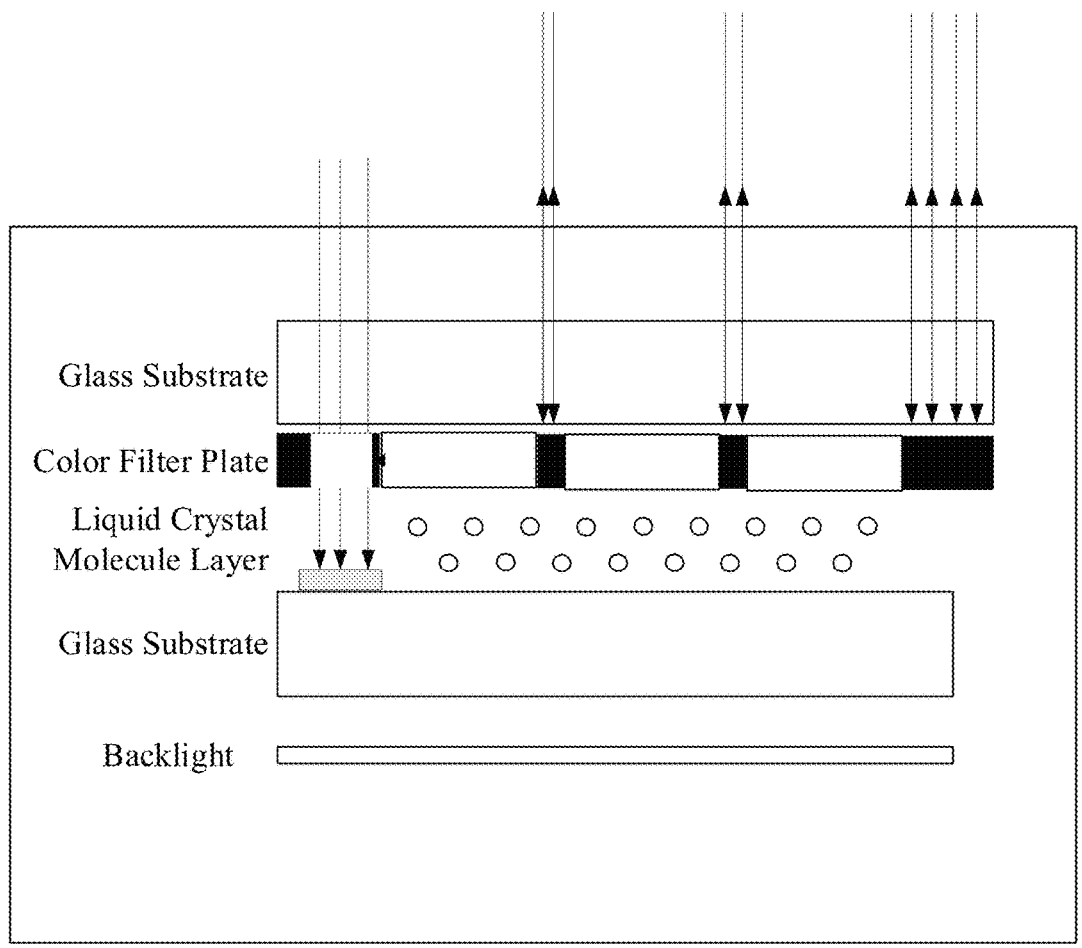
FIG. 7 is a schematic view of another example of display screen consistent with disclosed embodiments.

FIG. 6 is a schematic view of another example of display screen consistent with disclosed embodiments. As shown in FIG. 6, in some embodiments, the display screen may include an LCD. In the LCD, a liquid crystal cell is arranged between two parallel glass substrates. Thin film transistors (TFTs) are arranged over a lower glass substrate (TPS glass), and color filters, e.g., GRB filters, are arranged at an upper glass substrate (CF glass). Through signal and/or voltage changes of the TFTs, rotation directions of liquid crystal molecules in the liquid crystal cell may be controlled. Accordingly, whether polarized light of each pixel is emitted may be controlled to achieve displaying. A BM region may be arranged at a periphery of the CF Glass, like the leftmost part of the display screen shown in FIG. 4. In some embodiments, a portion of the light shielding material, e.g., the black ink, at a certain position of the BM region may be etched away, such that the position can become transparent. Further, the light intensity sensor may be arranged at a corresponding position at the TPS glass, e.g., LTPS glass. Accordingly, as shown in FIG. 7, light can transmit through the CF glass to reach the light intensity sensor. In some embodiments, the light intensity sensor may occupy an area in the order of microns, while a BM region usually may be larger than approximately 0.5 mm.

In some embodiments, a collection region of a light intensity sensor/ambient light sensor may correspond to a first position in the light shielding region(s), and the first position may correspond to a transparent window. The first position may be at a certain position of a light shielding array region or may be at a certain position of a light shielding continuous region. In some embodiments, the first position may be arranged at a certain position in the light shielding continuous region (BM region) for relatively convenient engineering and reduced cost.

In the embodiments above, LCD is described as an example of the display screen. In some other embodiments, the display screen can be another type of display screen, such as an organic light-emitting diode (OLED) display screen.

Figure 8:
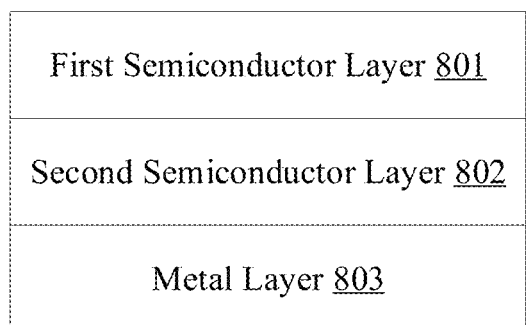
FIG. 8 is a schematic view of an example of light intensity sensor consistent with disclosed embodiments.

FIG. 8 is a schematic view of an example of light intensity sensor consistent with disclosed embodiments. As shown in FIG. 8, the light intensity sensor includes a first semiconductor layer 801, a second semiconductor layer 802, and a metal layer 803.

The second semiconductor layer 802 is arranged between the first semiconductor layer 801 and the metal layer 803. The first semiconductor layer 801 may be closer to the first glass substrate as compared to the metal layer 803. A light transmittance parameter of the first semiconductor layer 802 may be larger than or equal to a first preset threshold; and a light transmittance parameter of the metal layer 803 may be smaller than or equal to a second preset threshold.

A first electrode may be arranged over the first semiconductor layer. A first voltage may be applied to the first electrode. A second electrode may be arranged over the metal layer.

Ambient light may transmit through the first semiconductor layer and reach the second semiconductor layer to trigger the second semiconductor layer to generate induced charges. The induced charges may generate an induced electric current under the influence of the first voltage. The induced electric current may flow out through the second electrode of the metal layer.

Figure 9:
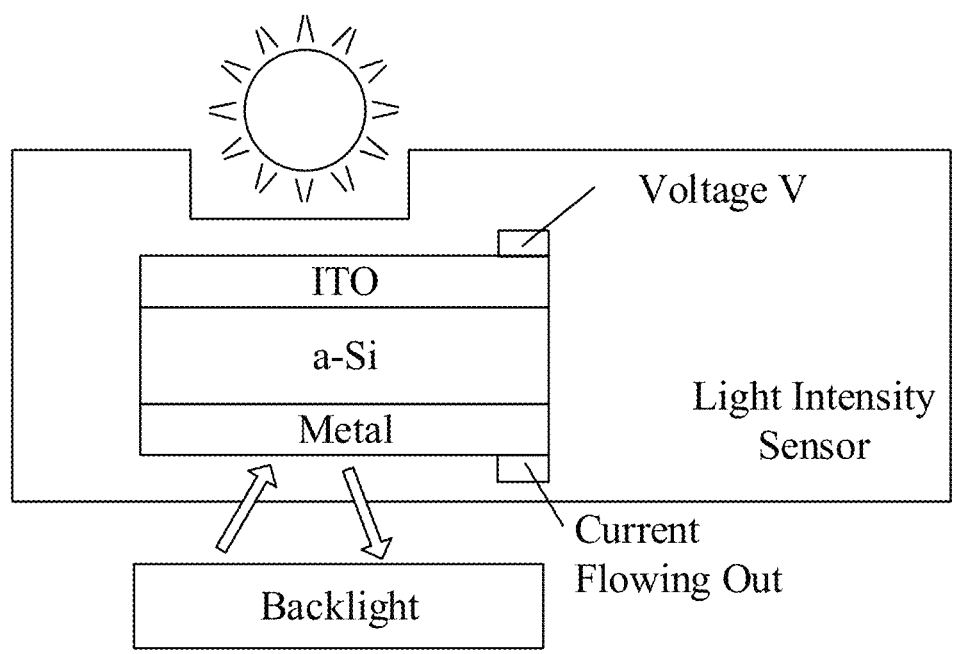
FIG. 9 is a schematic view of another example of light intensity sensor consistent with disclosed embodiments.

In some embodiments, as shown in FIG. 9, the first semiconductor layer includes an indium tin oxide (ITO) layer, and the second semiconductor layer includes an amorphous silicon (a-Si) layer. The metal layer may be opaque, which can prevent the background light from influencing a detection by the light intensity sensor. In the light intensity sensor, the a-Si semiconductor layer sandwiched between the ITO layer (a transparent film) and the metal layer is a layer that can exhibit a photo-current effect. In response to the external light incident on the a-Si semiconductor layer, charges can be generated in the a-Si semiconductor layer. The ITO layer includes a transparent structure, and is applied a voltage V through a corresponding electrode. The voltage V can cause the generated charges to flow in a certain direction. The metal layer is connected to an electrode, such as the second electrode, such that photocurrent is led out through the electrode.

Figure 10:
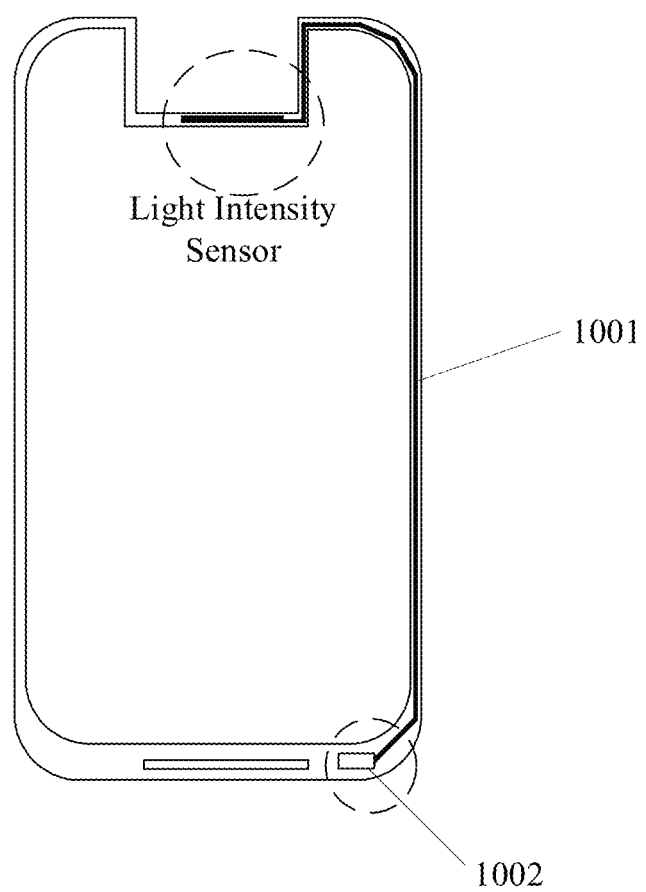
FIG. 10 is a schematic view of another example of display screen consistent with disclosed embodiments.

FIG. 10 is a schematic view of another example of display screen consistent with disclosed embodiments. As shown in FIG. 10, in some embodiments, the display screen further includes a signal processing circuit 1002, and the second electrode is connected to the signal processing circuit 1002 through a conductive wire 1001. The conductive wire 1001 and the signal processing circuit 1002 are arranged at one or more positions of the second glass substrate corresponding to the light shielding regions.

The induced electric current flowing from the second electrode may be conducted to the signal processing circuit 1002 through the conductive wire 1001. The induced electric current may be converted into a corresponding voltage signal by the signal processing circuit 1002, and a light intensity of the ambient light may be determined according to the voltage signal.

Figure 11:
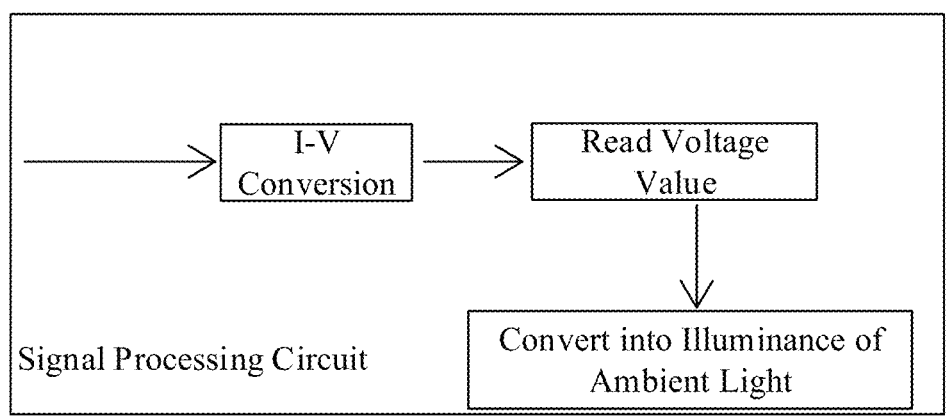
FIG. 11 is a diagram showing an example of signal conversion consistent with disclosed embodiments.

FIG. 11 is a diagram showing an example of signal conversion occurring in the signal processing circuit consistent with disclosed embodiments. As shown in FIG. 11, the signal processing circuit may perform a current-voltage (I-V) conversion on the photocurrent Iphoto, identify a magnitude of the voltage, and determine a light intensity of the ambient light. The larger the external ambient light intensity is, the larger the photocurrent and the converted voltage are. Thus, the voltage magnitude and the external ambient light intensity may have a certain correspondence.

Figure 12:
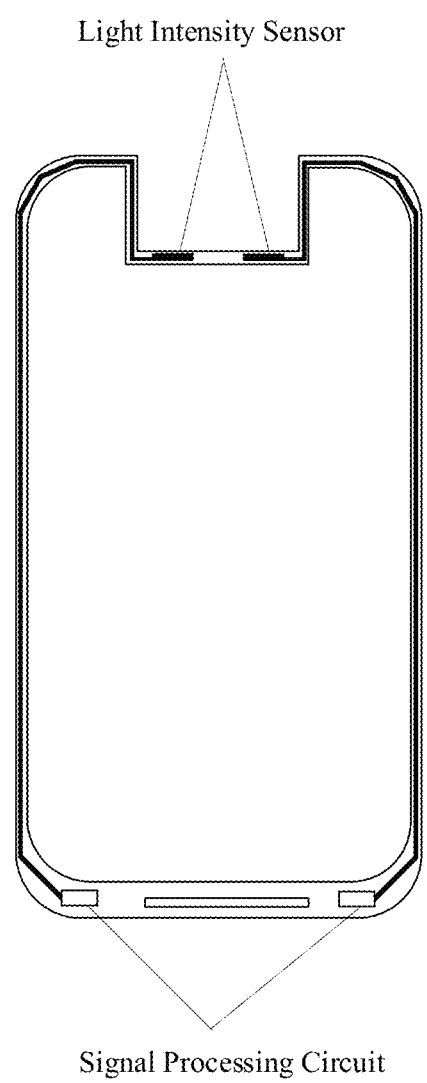
FIG. 12 is a schematic view of another example of display screen consistent with disclosed embodiments.

FIG. 12 is a schematic view of another example of display screen consistent with disclosed embodiments. As shown in FIG. 12, light shielding materials at two or more first positions of the light shielding regions of the first glass substrate are etched away. Two or more light intensity sensors are provided at two or more second positions of the second glass substrate corresponding to the two or more first positions, respectively.

In some embodiments, the two or more light intensity sensors are connected to different signal processing circuits through corresponding conductive wires.

In some other embodiments, the two or more light intensity sensors may be connected to one same signal processing circuit through corresponding conductive wires.

The present disclosure provides an electronic device including a display screen consistent with the disclosure, such as one of the above-described display screens.

FIG. 13 is a flowchart of an example of light intensity detection method consistent with disclosed embodiments. With reference to FIG. 13, the light intensity detection method is described below.

At 1301, an induced electric current is generated by using a light intensity sensor arranged at a second position of the second glass substrate of the display screen to detect a light intensity of light passing through a first position of the light shielding regions of the first glass substrate, where the light shielding material at the first position of the light shielding regions is etched away.

In some embodiments, the light intensity sensor may include a first semiconductor layer, a second semiconductor layer, and a metal layer.

Generating the induced electric current by using the light intensity sensor arranged at the second position of the second glass substrate of the display screen to detect the light intensity of light passing through the first position of the light shielding regions of the first glass substrate may include triggering the second semiconductor layer to generate induced charges by the ambient light passing through the first semiconductor layer and reaching the second semiconductor layer; and generating the induced electric current by the induced charges under the first voltage. The induced electric current flows out through the second electrode on the metal layer.

At 1302, the induced electric current is converted into a voltage signal, and a light intensity of the ambient light is determined according to the voltage signal.

In some embodiments, the method further includes introducing ambient light of different light intensities on the light intensity sensor, detecting induced electric currents corresponding to light intensities of the ambient light, and determining voltages corresponding to the induced electric currents; and recording a correspondence between the light intensities and the voltages.

In some embodiments, determining the light intensity of the ambient light according to the voltage signal may include determining the light intensity of the ambient light corresponding to the voltage signal, according to the correspondence between the light intensities and the voltages.

Figure 14:
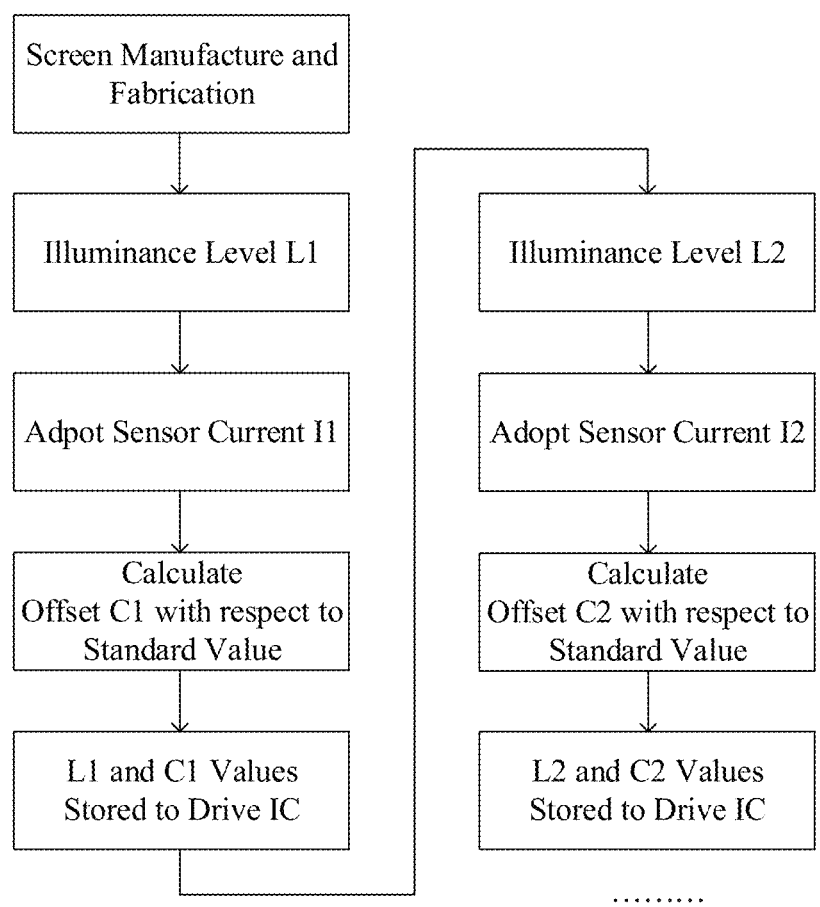
FIG. 14 is a flowchart of an example of calibration for a light intensity sensor consistent with disclosed embodiments.

FIG. 14 is a flowchart of an example of calibration for a light intensity sensor consistent with disclosed embodiments. Due to variations in the process of fabricating display screens, during the actual use, with a same external ambient light intensity, electric currents detected by light intensity sensors of different display screens may be different, and a calibration method can be used to compensate for the difference. As shown in FIG. 14, after a display screen is manufactured and fabricated, light sources of different illuminance are respectively used to illuminate the display screen; electric current values of the light intensity sensor are collected and compared to standard values to calculate electric current compensation values, such as offset C1, C2, ..., and Cn, under different illuminances. The compensation value may be, for example, a positive number or a negative number. Correspondences between illuminance levels and compensation values, L1-C1, L2-C2, Ln-Cn, are recorded in a driver integrated circuit (IC) of the display screen. Accordingly, each display screen may appear the same in terms of using the whole device.

The present disclosure provides a display screen, an electronic device, and a light intensity detection method. The display screen may include a first glass substrate having color filter regions and light shielding regions over the first glass substrate. The light shielding regions may be located at peripheries of the color filter regions. The display screen may further include a second glass substrate having display control circuits disposed thereon. The display control circuits may be used for controlling display statuses of color filter regions arranged over the first glass substrate. A light shielding material may be etched away at a first position of light shielding regions of the first glass substrate, and a light intensity sensor may be arranged at a second position of the second glass substrate. The first position and the second position may satisfy a preset relative position relation, such that the light intensity of light transmitted through the first position may shine on the light intensity sensor.

In the present disclosure, the disclosed embodiments and the features of the disclosed embodiments may be combined as long as they do not conflict with each other.

The disclosed systems, apparatuses, and methods may be implemented in other manners not described here. For example, the devices described above are merely illustrative. For example, the division of units may only be a logical function division, and there may be other ways of dividing the units. For example, multiple units or components may be combined or may be integrated into another system, or some features may be ignored, or not executed. Further, the coupling or direct coupling or communication connection shown or discussed may include a direct connection or an indirect connection or communication connection through one or more interfaces, devices, or units, which may be electrical, mechanical, or in other form.

The units described as separate components may or may not be physically separate, and a component shown as a unit may or may not be a physical unit. That is, the units may be located in one place or may be distributed over a plurality of network elements. Some or all of the components may be selected according to the actual needs to achieve the object of the present disclosure.

In addition, the functional units in the various embodiments of the present disclosure may be integrated in one processing unit, or each unit may be an individual physically unit, or two or more units may be integrated in one unit. The above-mentioned integrated unit can be implemented in the form of hardware or in the form of hardware plus software functional unit.

It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A display screen comprising:
    a first glass substrate including a color filter region and a light shield, wherein the light shield includes a transparent region at a first position of the light shield;
    a second glass substrate including a display control circuit, wherein the display control circuit controls display statuses of the color filter region;
    a liquid crystal layer sandwiched between the first glass substrate and the second glass substrate, wherein the liquid crystal layer includes a plurality of liquid crystal cells; and
    a light intensity sensor at a second position of the second glass substrate, the light intensity sensor including:
        a first semiconductor layer having a first light transmittance larger than a first preset threshold;
        a metal layer having a second light transmittance smaller than or equal to a second preset threshold, the first semiconductor layer being closer to the first glass substrate than the metal layer;
        a second semiconductor layer sandwiched between the first semiconductor layer and the metal layer;
        a first electrode arranged at the first semiconductor layer to receive a voltage; and
        a second electrode arranged at the metal layer to output an induced electric current formed by induced charges generated at the second semiconductor layer by ambient light passing through the first semiconductor layer and reaching the second semiconductor layer;
    a signal processing circuit; and
    a conductive wire connecting the second electrode to the signal processing circuit wherein:
        the first position and the second position satisfy a preset relative positional correspondence to allow light transmitted through the transparent region at the first position to reach the light intensity sensor without passing through the liquid crystal cells and without being reflected,
        each of the conductive wire and the signal processing circuit is arranged at one of one or more positions on the second glass substrate corresponding to the light shield,
        the conductive wire conducts the induced electric current from the second electrode to the signal processing circuit, and
        the signal processing circuit converts the induced electric current into a voltage signal and determine a light intensity of the ambient light according to the voltage signal.

2. The display screen according to claim 1, wherein the light shield includes:
    a light shield array distributed between pixels of the color filter region; and
    a continuous light shield at peripheries of the color filter region.

3. The display screen according to claim 1, wherein:
    the light shield includes two or more transparent regions each at one of two or more first positions of the light shield, and
    the second glass substrate includes two or more light intensity sensors each at one of two or more second positions on the second glass substrate that correspond to the two or more first positions, respectively.

4. The display screen according to claim 3, wherein the two or more light intensity sensors are connected to the signal processing circuit through respective conductive wires.

5. The display screen according to claim 3, wherein:
    the signal processing circuit is one of a plurality of signal processing circuits of the display screen, and
    the two or more light intensity sensors are connected to different ones of the plurality of signal processing circuits through respective conductive wires.

6. An electronic device, comprising the display screen according to claim 1.

7. A light intensity detection method comprising:
    generating an induced electric current by using a light intensity sensor to detect a light intensity of ambient light passing through a transparent region at a first position of a light shield of a first glass substrate of a display screen, the light intensity sensor being at a second position of a second glass substrate of the display screen that corresponds to the first position and including a first semiconductor layer, a metal layer, and a second semiconductor layer sandwiched between the first semiconductor layer and the metal layer, and generating the induced electric current including:
        triggering the second semiconductor layer to generate induced charges by ambient light transmitting through the first semiconductor layer and reaching the second semiconductor layer, and
        generating the induced electric current through the induced charges under an influence of a voltage, the induced electric current flowing out of the light intensity sensor through an electrode at the metal layer;
    converting the induced electric current into a voltage signal; and
    determining a light intensity of the ambient light according to the voltage signal,
    wherein the first position and the second position satisfy a preset relative positional correspondence to allow the ambient light transmitted through the transparent region at the first position to reach the light intensity sensor without passing through liquid crystal cells of a liquid crystal layer sandwiched between the first glass substrate and the second glass substrate, and without being reflected.

8. The method according to claim 7, further comprising:
    irradiating reference ambient light of different reference light intensities on the light intensity sensor;

detecting induced electric currents corresponding to the reference light intensities;
determining reference voltages corresponding to the induced electric currents; and
recording a correspondence between the reference light intensities and the reference voltages,
wherein determining the light intensity of the ambient light according to the voltage signal includes determining the light intensity of the ambient light corresponding to the voltage signal according to the correspondence between the reference light intensities and the reference voltages.

\* \* \* \* \*